United States Patent
Tsai et al.

(10) Patent No.: US 10,991,800 B2
(45) Date of Patent: Apr. 27, 2021

(54) METHOD FOR FINFET LDD DOPING

(71) Applicant: Taiwan Semiconductor Manufacturing Co., Ltd., Hsinchu (TW)

(72) Inventors: Chun Hsiung Tsai, Hsinchu County (TW); Ya-Yun Cheng, Taichung (TW); Shahaji B. More, Hsinchu (TW); Cheng-Yi Peng, Taipei (TW); Wei-Yang Lee, Taipei (TW); Kuo-Feng Yu, Hsinchu County (TW); Yen-Ming Chen, Hsin-Chu County (TW); Jian-Hao Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/421,036

(22) Filed: May 23, 2019

(65) Prior Publication Data

US 2019/0288067 A1   Sep. 19, 2019

Related U.S. Application Data

(62) Division of application No. 15/882,285, filed on Jan. 29, 2018, now Pat. No. 10,396,156.

(51) Int. Cl.
*H01L 29/08* (2006.01)
*H01L 21/265* (2006.01)
(Continued)

(52) U.S. Cl.
CPC ...... *H01L 29/0847* (2013.01); *H01L 21/0217* (2013.01); *H01L 21/02636* (2013.01);
(Continued)

(58) Field of Classification Search
CPC ............. H01L 29/0847; H01L 29/7833; H01L 29/66575; H01L 21/02636; H01L 29/36;
(Continued)

(56) References Cited

U.S. PATENT DOCUMENTS 9,337,316 B2   5/2016  Tsai
2008/0265321 A1*  10/2008  Yu ..................... H01L 29/66795
257/344

(Continued)

OTHER PUBLICATIONS

Murakami, Kouichi et al., "Electronic Energy Level of Off-Center Substitutional Nitrogen in Silicon: Determination by Electron Spin Resonance Measurements", Japanese Journal of Applied Physics, vol. 27, No. 8, Aug. 1988, pp. L1414-L1416.
(Continued)

*Primary Examiner* — Hoang-Quan Ho
(74) *Attorney, Agent, or Firm* — Haynes and Boone, LLP

(57) ABSTRACT

A semiconductor device includes a substrate, an isolation structure over the substrate, a fin over the substrate and the isolation structure, a gate structure engaging a first portion of the fin, first sidewall spacers over sidewalls of the gate structure and over a second portion of the fin, source/drain (S/D) features adjacent to the first sidewall spacers, and second sidewall spacers over the isolation structure and over sidewalls of a portion of the S/D features. The second sidewall spacers and the second portion of the fin include a same dopant.

18 Claims, 19 Drawing Sheets

(51) Int. Cl.

| | | |
|---|---|---|
| *H01L 29/66* | (2006.01) | |
| *H01L 21/306* | (2006.01) | |
| *H01L 29/167* | (2006.01) | |
| *H01L 21/02* | (2006.01) | |
| *H01L 29/06* | (2006.01) | |
| *H01L 29/78* | (2006.01) | |
| *H01L 29/36* | (2006.01) | |
| *H01L 21/266* | (2006.01) | |
| *H01L 29/165* | (2006.01) | |

(52) U.S. Cl.
CPC .. *H01L 21/26513* (2013.01); *H01L 21/26586* (2013.01); *H01L 21/30604* (2013.01); *H01L 29/0649* (2013.01); *H01L 29/167* (2013.01); *H01L 29/36* (2013.01); *H01L 29/6656* (2013.01); *H01L 29/66575* (2013.01); *H01L 29/66636* (2013.01); *H01L 29/66795* (2013.01); *H01L 29/7833* (2013.01); *H01L 29/7851* (2013.01); *H01L 21/02529* (2013.01); *H01L 21/02532* (2013.01); *H01L 21/266* (2013.01); *H01L 29/165* (2013.01); *H01L 29/66545* (2013.01); *H01L 29/7848* (2013.01)

(58) Field of Classification Search
CPC ............. H01L 29/7851; H01L 29/0649; H01L 21/0217; H01L 21/26586; H01L 29/167; H01L 29/66636; H01L 21/30604; H01L 29/6656; H01L 21/26513; H01L 29/165; H01L 21/02532; H01L 21/02529; H01L 21/266; H01L 29/66545; H01L 29/7848; H01L 27/10826; H01L 27/10879; H01L 27/1211; H01L 27/0886; H01L 27/0924; H01L 29/41791; H01L 29/66795–6681; H01L 29/785–7856; H01L 2029/7857–7858; H01L 2924/13067; H01L 29/66553

See application file for complete search history.

(56) References Cited

U.S. PATENT DOCUMENTS

| | | |
|---|---|---|
| 2013/0093026 A1 | 4/2013 | Wann et al. |
| 2013/0200470 A1 | 8/2013 | Liu et al. |
| 2014/0191318 A1 | 7/2014 | Lin et al. |
| 2016/0197075 A1 | 7/2016 | Li et al. |
| 2016/0197182 A1 | 7/2016 | Li |
| 2016/0240534 A1* | 8/2016 | Murthy ............... H01L 21/3065 |
| 2017/0069737 A1* | 3/2017 | Choi .................... H01L 29/785 |
| 2017/0250278 A1 | 8/2017 | Tsai et al. |

OTHER PUBLICATIONS

Shimura, Fumio, "Semiconductor Silicon Crystal Technology", 1$^{st}$ Edition, Chapter 5, published Dec. 28, 1988, 101 pages.

* cited by examiner

METHOD FOR FINFET LDD DOPING

PRIORITY

This is a divisional of U.S. patent application Ser. No. 15/882,285, filed Jan. 29, 2018, herein incorporated by reference in its entirety.

BACKGROUND

As the semiconductor industry has strived for higher device density, higher performance, and lower costs, problems involving both fabrication and design have been encountered. One solution to these problems has been the development of a fin-like field effect transistor (FinFET). A typical FinFET includes a thin vertical "fin" of semiconductor materials. The source, drain, and channel regions are defined within this fin. The transistor's gate is wrapped around the channel region of the fin, engaging it on both the top and the sidewalls of the fin. This configuration allows the gate to induce current flow in the channel from three sides. Thus, FinFET devices have the benefit of higher current flow and reduced short channel effects.

However, there are various challenges in fabricating FinFET devices. For example, ion implantation, traditionally used for doping planar devices, has been similarly used for doping FinFET devices to create lightly doped source/drain (LDD) regions (or source/drain extensions) in the fin. But due to its directional effect, ion implantation has been found quite ineffective in creating uniform dopant concentration in the three-dimensional fin. For example, top portions of a fin typically get much higher dopant concentration than its lower portions because the height of the fin typically exceeds the capability of the ion implanters. Tilted ion implantation is also not very effective for FinFET due to so-called shadowing effects where nearby structures (e.g., nearby fins, gates, and/or photoresist masking elements) block the path of the ions. Consequently, not all advantages of the FinFET devices are realized.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
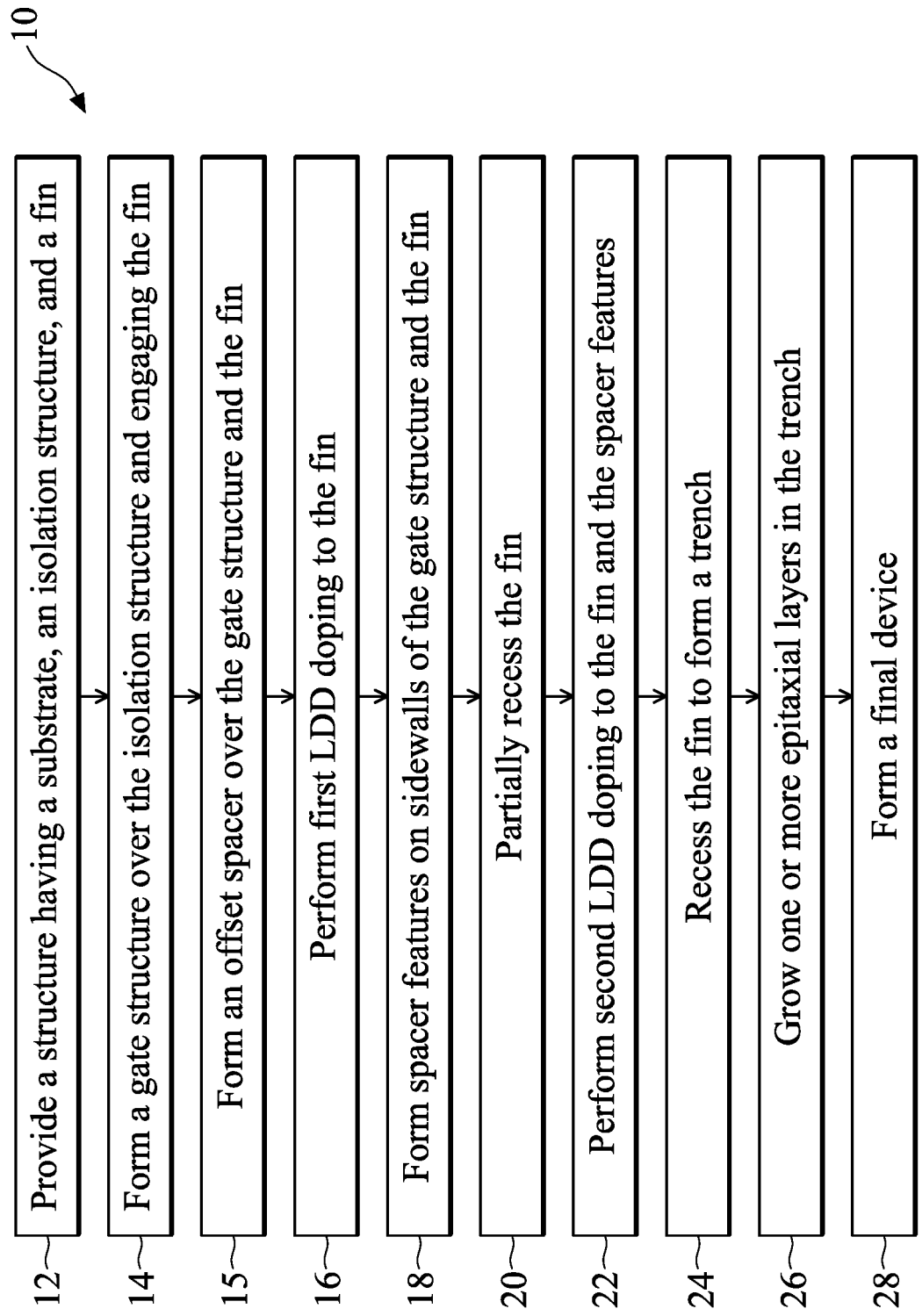
FIG. 1 shows a flow chart of a method of forming a semiconductor device according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and methods of forming the same. More particularly, the present disclosure is related to forming source/drain (S/D) extensions (or LDD regions) in FinFET devices. An embodiment of the present disclosure applies a process having ion implantation, etching, and another ion implantation in conjunction with fin sidewall spacers to substantially dope LDD regions of fins. It overcomes the shadowing effects and the limitations on ion implanter. As a result, the LDD regions of the fins are near uniformly doped with proper dopant(s), maximizing the benefits provided by three-dimensional FinFET technologies.

FIG. 1 shows a flow chart of a method 10 of forming a semiconductor device 100. Method 10 is described below in conjunction with FIGS. 2-10C which are perspective and cross-sectional views of the semiconductor device 100 in various stages of a manufacturing process. Particularly, FIGS. 2, 3A, 4A, 5A, 6A, 7A, 8A, 9A, and 10A are perspective views of a portion of the device 100; and FIGS. 3B, 4B, 5B, 6B, 7B, 8B, 9B, 10B, and 10C are cross-sectional views of the portion of the device 100 along a fin length direction. The method 10 is merely an example, and is not intended to limit the present disclosure beyond what is explicitly recited in the claims. Additional operations can be provided before, during, and after the method 10, and some operations described can be replaced, eliminated, or relocated for additional embodiments of the method.

Further, the semiconductor device 100 is provided for illustration purposes and does not necessarily limit the embodiments of the present disclosure to any number of fins, any number of gates, any number of regions, or any configuration of structures or regions. The semiconductor device 100 may be an intermediate device fabricated during processing of an integrated circuit (IC), or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs and gate all-around (GAA) FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 2:
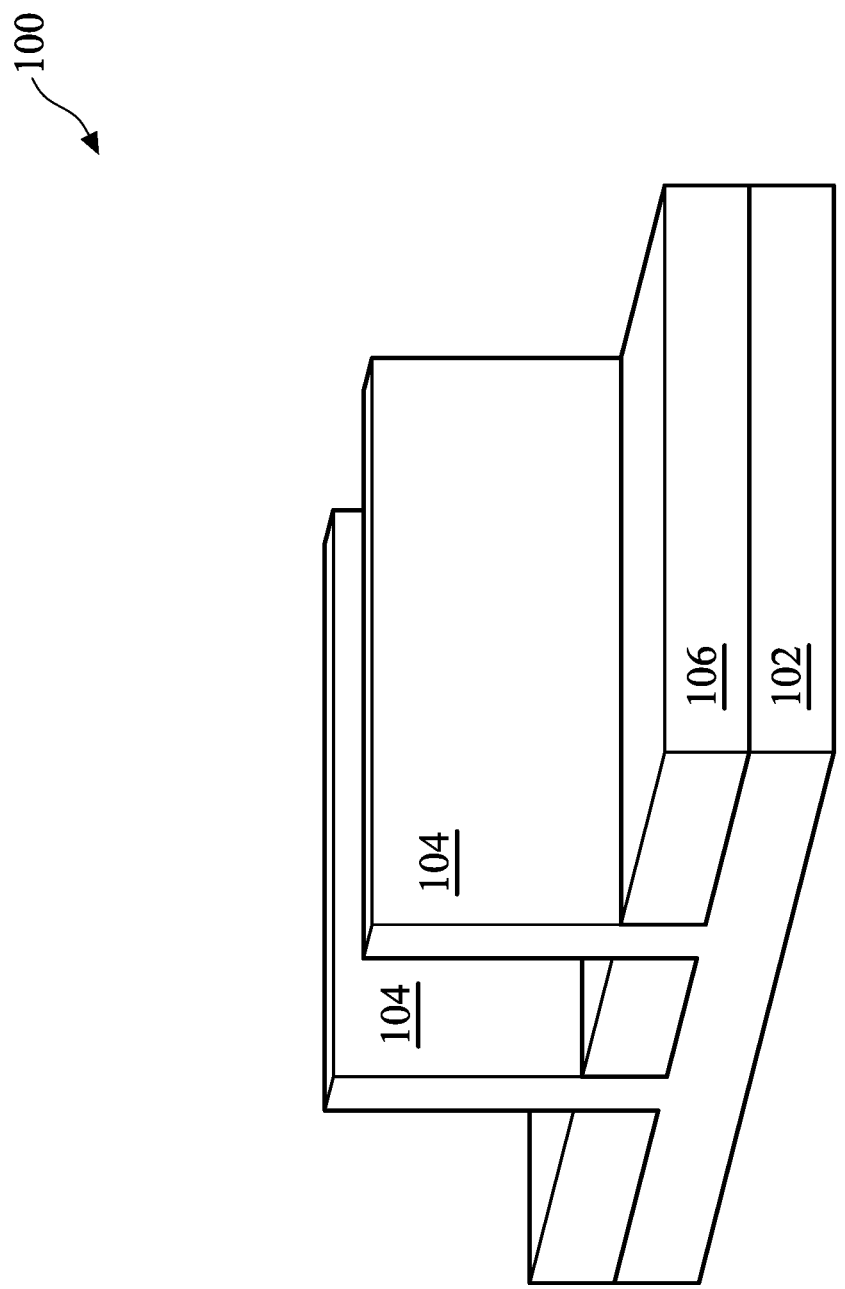
FIGS. 2, 3A, 4A, 5A, 6A, 7A, 8A, 9A, and 10A are perspective views of a portion of a semiconductor device during various manufacturing stages according to the method in FIG. 1, in accordance with embodiments of the present disclosure.

Referring to FIG. 1, at operation 12, method 10 provides a structure of the device 100 as shown in FIG. 2. Referring now to FIG. 2, the device 100 includes a substrate 102, one or more fins 104 (two shown) over the substrate 102, and an isolation structure 106 over the substrate 102 and isolating the fins 104.

The substrate 102 is a silicon (Si) substrate in the present embodiment. In alternative embodiments, the substrate 102 includes other elementary semiconductors such as germanium (Ge); a compound semiconductor such as silicon carbide (SiC), gallium arsenide (GaAs), indium arsenide (InAs), and indium phosphide (InP); or an alloy semiconductor, such as silicon germanium carbide (SiGeC), gallium arsenic phosphide (GaAsP), and gallium indium phosphide (GaInP). In embodiments, the substrate 102 may include silicon on insulator (SOI) substrate, be strained and/or stressed for performance enhancement, include epitaxial regions, doped regions, and/or include other suitable features and layers.

The fins 104 may include one or more layers of semiconductor materials such as silicon or silicon germanium. In an embodiment, the fins 104 include multiple layers of semiconductor materials alternately stacked one over the other, for example, having multiple layers of silicon and multiple layers of silicon germanium alternately stacked. The fins 104 may be patterned by any suitable method. For example, the fins 104 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 102 and patterned using a photolithography process. Spacers are formed alongside the patterned sacrificial layer using a self-aligned process. The sacrificial layer is then removed, and the remaining spacers, or mandrels, may then be used as a masking element for patterning the fins 104. For example, the masking element may be used for etching recesses into semiconductor layers over or in the substrate 102, producing the fins 104. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 104 may be suitable.

The isolation structure 106 may include silicon oxide ($SiO_2$), silicon nitride ($Si_3N_4$), silicon oxynitride (SiON), fluoride-doped silicate glass (FSG), a low-k dielectric material, and/or other suitable insulating material. In an embodiment, the isolation structure 106 is formed by etching trenches over or in the substrate 102 (e.g., as part of the process of forming the fins 104), filling the trenches with an insulating material, and performing a chemical mechanical planarization (CMP) process and/or an etching back process to the insulating material. Other types of isolation structure may also be suitable, such as field oxide and LOCal Oxidation of Silicon (LOCOS). The isolation structure 106 may include multiple layers, such as a liner layer over the surfaces of the fins 104 and the substrate 102, and a main isolating layer over the liner layer.

Figure 3A:
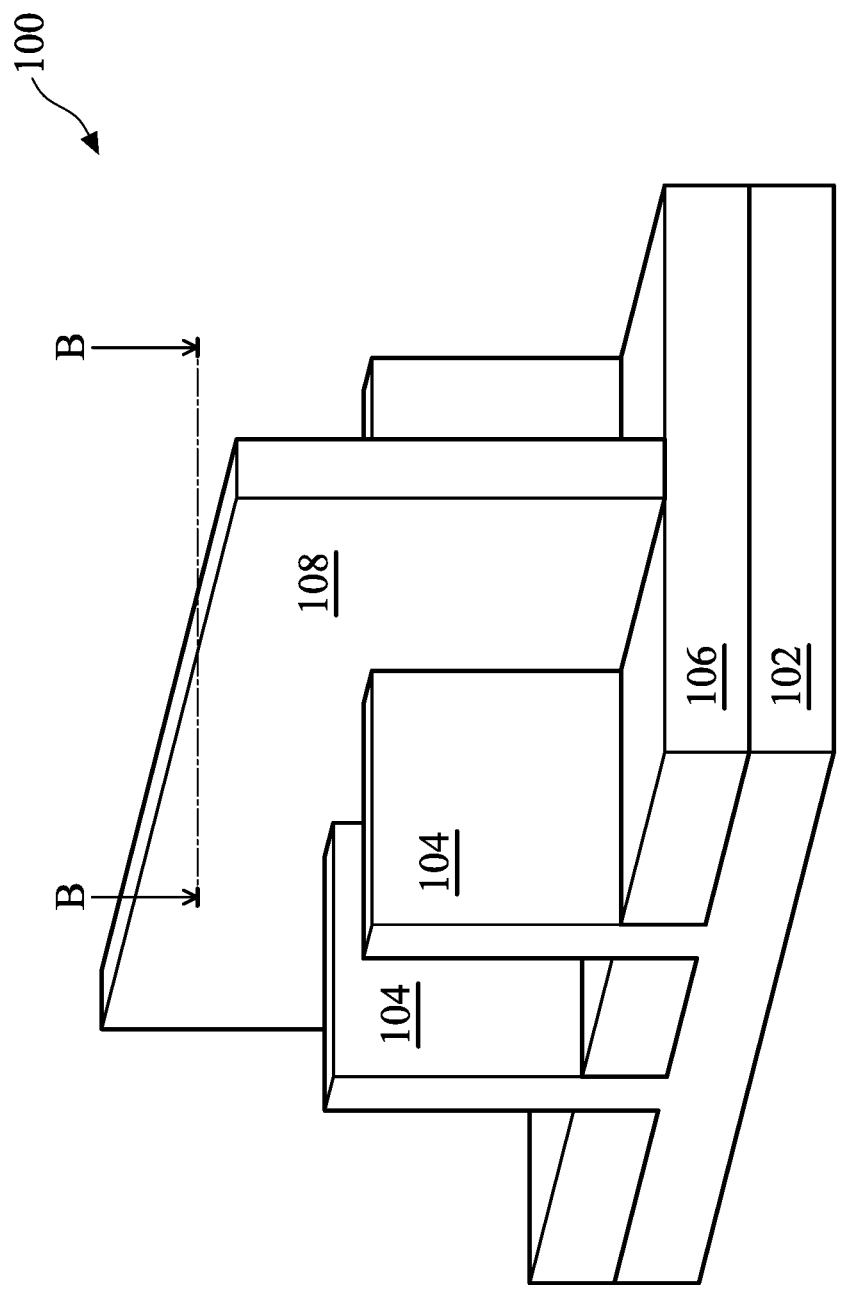
Figure 3B:
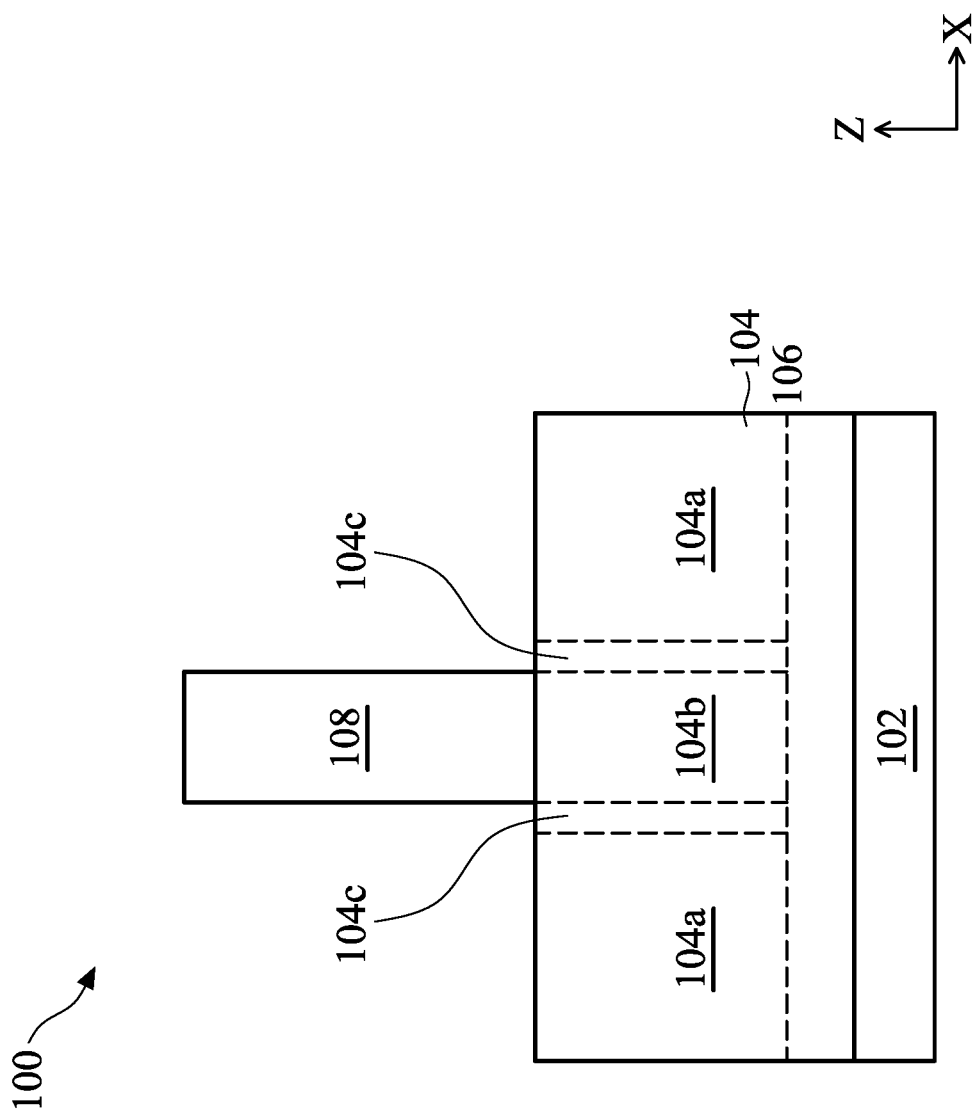
FIGS. 3B, 4B, 5B, 6B, 7B, 8B, 9B, 10B, and 10C are cross-sectional views (along a fin length direction) of a portion of a semiconductor device during various manufacturing stages according to the method in FIG. 1, in accordance with embodiments of the present disclosure.

At operation 14, the method 10 (FIG. 1) forms a gate structure 108 over the isolation structure 106 and engaging one or more of the fins 104. Referring to FIG. 3A, in this example, the gate structure 108 engages two fins 104. In various embodiments, the gate structure 108 may engage any number of fins 104. Further, the gate structure 108 is disposed over top and sidewall surfaces of the fins 104 in this embodiment. In an alternative embodiment, the gate structure 108 may be disposed over the sidewall surfaces, but not the top surface, of the fins 104. FIG. 3B illustrates a cross-sectional view of the device 100 cut along the B-B line in FIG. 3A, where the top surface of the isolation structure 106 is indicated with a horizontal dashed line. Referring to FIG. 3B, the gate structure 108 is disposed over a channel region 104b of the fins 104. The fins 104 further include S/D regions 104a on both sides of the channel region 104b, and two S/D extension regions 104c between the channel region 104b and the S/D regions 104a.

The gate structure 108 may include multiple layers, such as an interfacial layer and a gate electrode layer. The interfacial layer may include a dielectric material such as silicon oxide ($SiO_2$) or silicon oxynitride (SiON), and may be formed by chemical oxidation, thermal oxidation, atomic layer deposition (ALD), chemical vapor deposition (CVD), and/or other suitable methods. The gate electrode layer may include polysilicon or other suitable materials, and may be formed by suitable deposition processes such as low-pressure CVD (LPCVD) and plasma-enhanced CVD (PECVD). In an embodiment, the gate structure 108 further includes one or more hard mask layers as its top layer(s) and the hard mask layer(s) may include silicon oxide and/or silicon nitride. In an embodiment, the gate structure 108 is a placeholder (so-called "dummy gate" or "temporary gate"), wherein one or more of the layers in the gate structure 108 are replaced in a later process, for example, for forming a high-k metal gate. In an embodiment, the various layers of the gate structure 108 are deposited as blanket layers over the fins 104 and the isolation structure 106. Then, a masking element is created using a photolithography process, and the blanket layers are etched through the masking element to form the gate structure 108.

Figure 4A:
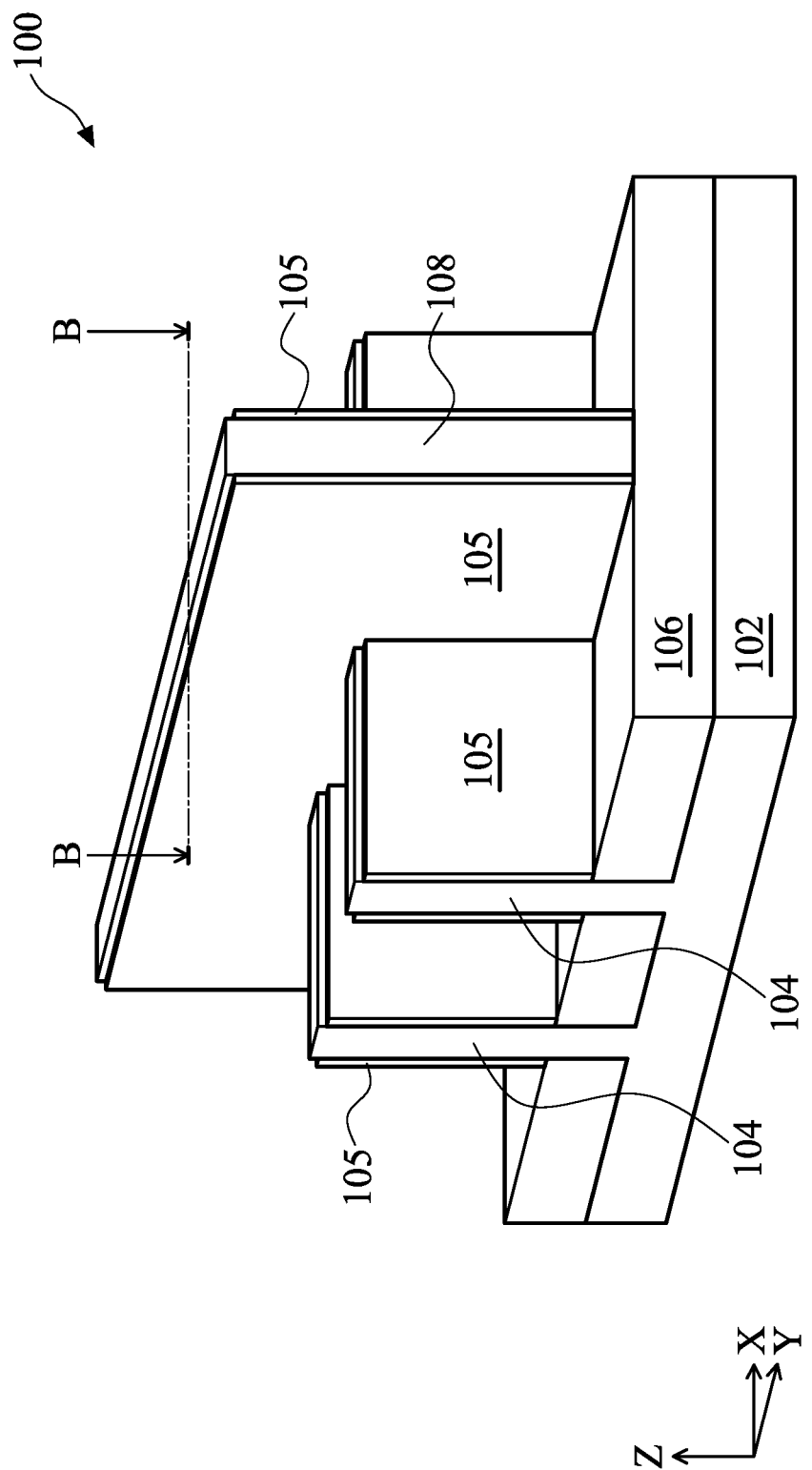
Figure 4B:
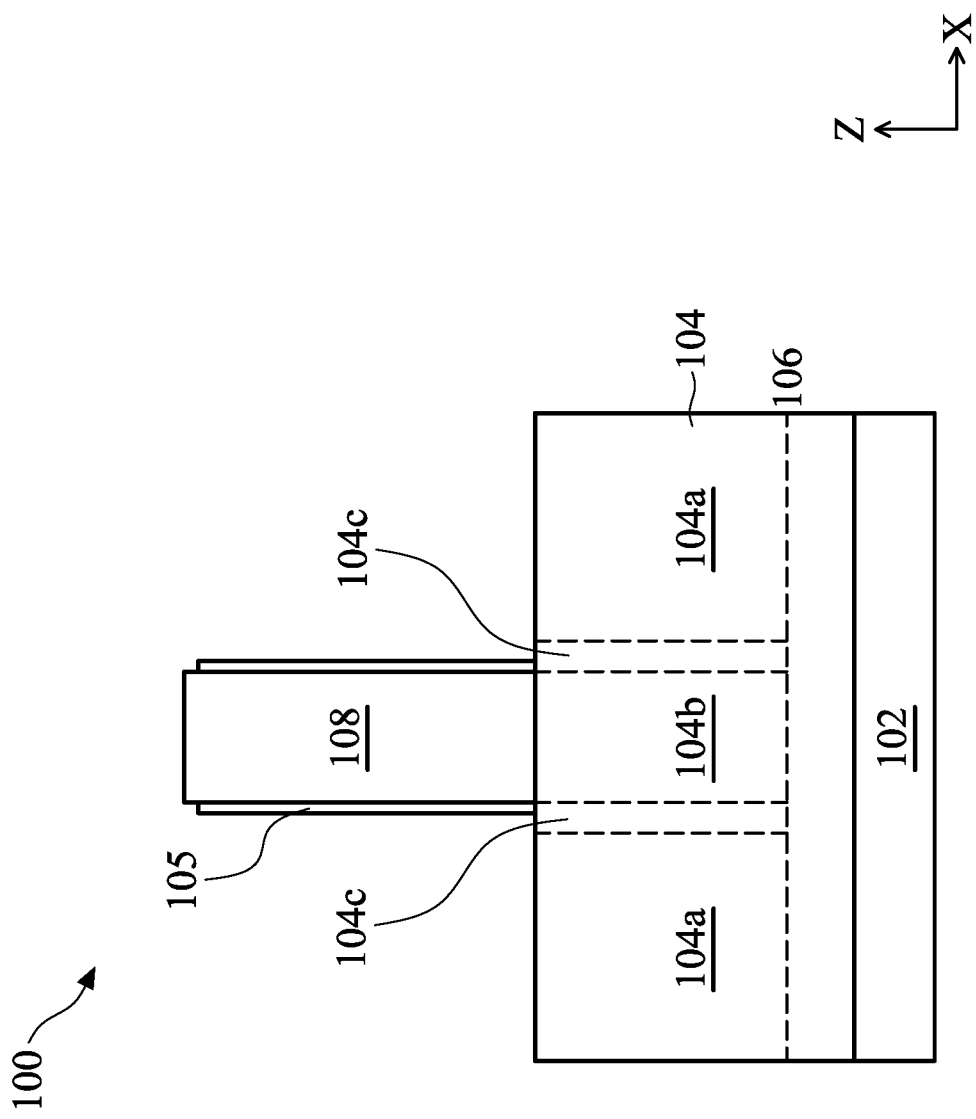

At operation 15, the method 10 (FIG. 1) forms an offset spacer 105 over sidewalls of the gate structure 108 and the fins 104. Referring to FIGS. 4A and 4B, the offset spacer 105 may be formed to have a thickness ranging from about 1 nm to about 10 nm (along the X direction). In various embodiments, the offset spacer 105 may include a suitable dielectric material such as silicon oxide ($SiO_2$), silicon oxynitride (SiON), or other suitable dielectric material(s). The offset spacer 105 may be formed by first depositing a blanket dielectric layer over the gate structure 108 and the fins 104 using thermal oxidation, CVD, ALD, or other suitable deposition methods, and then anisotropically etching the blanket dielectric layer to remove it from the top surfaces of the isolation structure 106, the gate structure 108, and the fins 104. The portions of the blanket dielectric layer remaining on the sidewalls of the gate structure 108 and the fins 104 become the offset spacer 105.

Figure 5A:
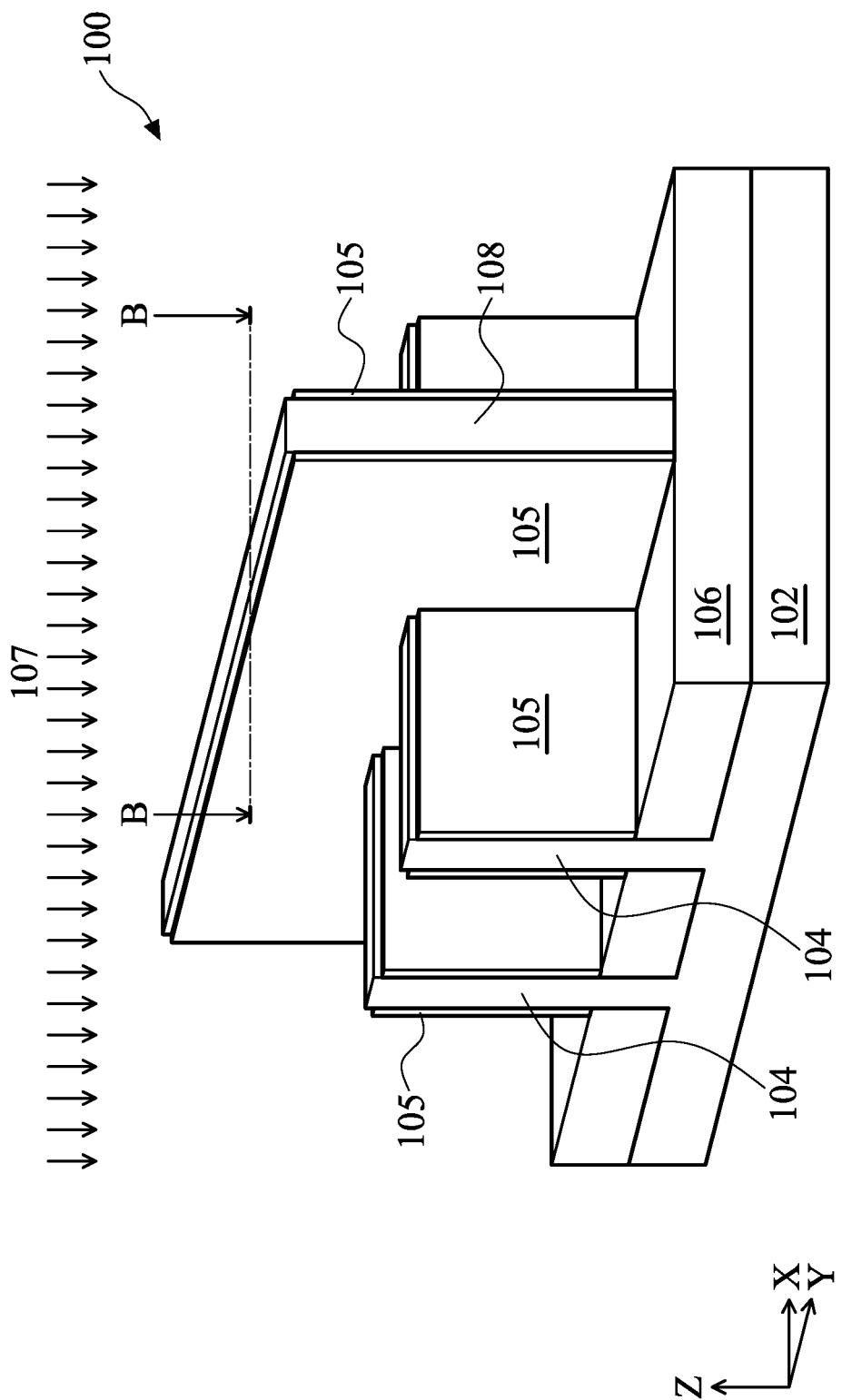

At operation 16, the method 10 (FIG. 1) applies an ion implantation process 107 to introduce a dopant into the device 100, particularly into the fins 104 in a self-aligned fashion. Referring to FIG. 5A, the ion implantation process 107 is applied from the top of the device 100. In an embodiment, the ion implantation process 107 is applied with a tilt angle about 5° or less (the tilt angle is defined with respect to the normal, Z, of the substrate 102). The tilt angle takes into account various factors including the height and pitch of the fins 104, the height and pitch of the gate structures 108, and the height of an ion implantation mask (not shown) that covers regions of the device 100 not to be doped by the operation 16. If the tilt angle is too large, shadowing effects may block the dopant from reaching certain portions of the fins 104.

Figure 5B:
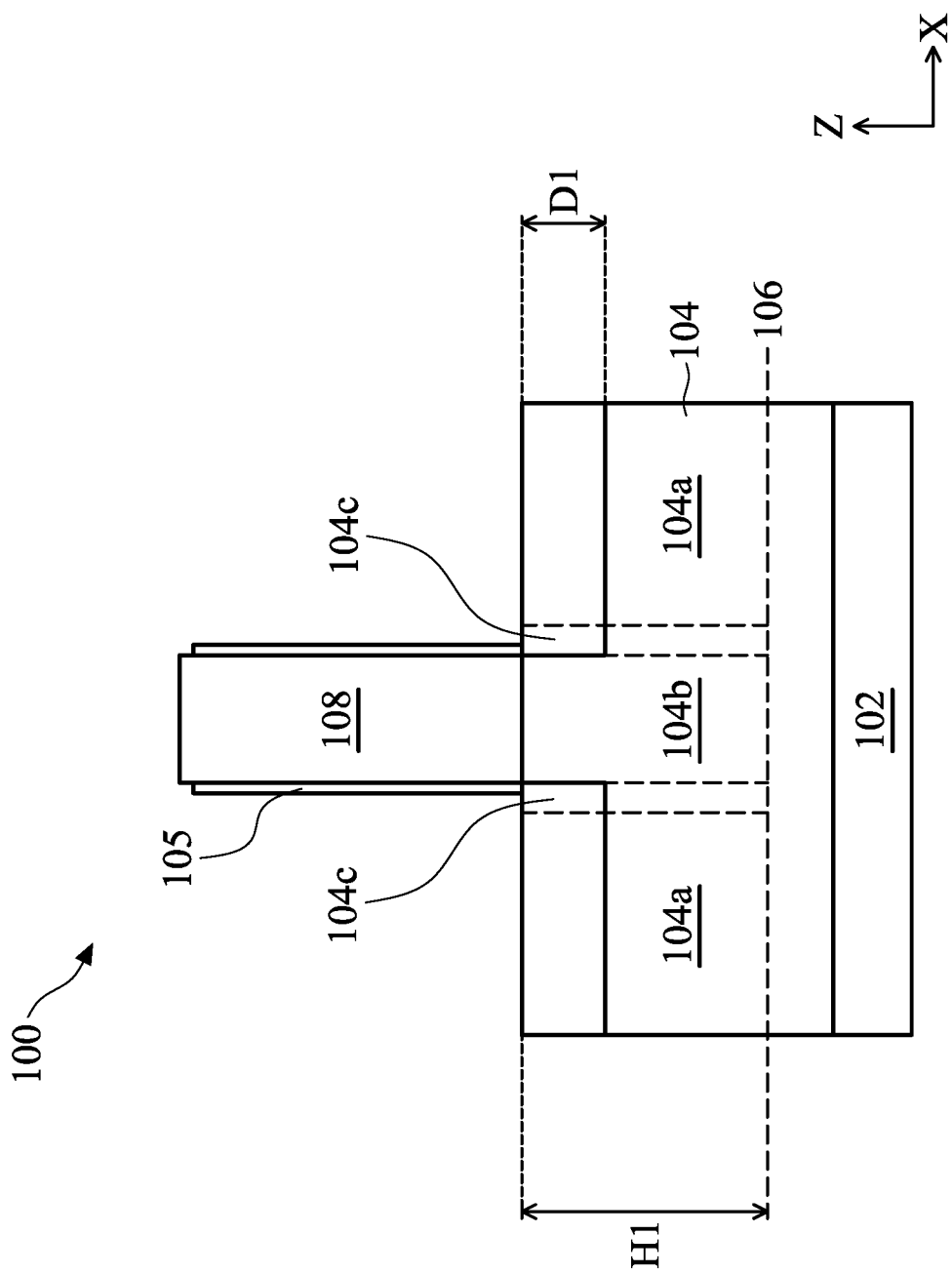

FIG. 5B illustrates a cross-sectional view of the device 100 cut along the B-B line in FIG. 5A, showing the results of the ion implantation process 107. Since the channel region 104b is covered by the gate structure 108, it is not doped by the ion implantation process 107. In other words, the amount of the dopant introduced into the channel region 104b by the operation 16 is negligible. In contrast, the S/D regions 104a and the extension regions 104c receive the dopant in the respective upper portions thereof. In the present embodiment, the dopant is introduced into the fins 104 up to a depth D1. The fins 104 have a height H1 as measured from the top surface of the isolation structure 106 to the top surface of the fins 104. In an embodiment, the height H1 is in a range from about 40 nanometers (nm) to about 80 nm, such as from about 50 nm to about 70 nm. The depth D1 may be a function of doping energy, dopant species, and the material in the fins 104. The dopant may be an n-type dopant such as phosphorus (P) or arsenic (As). Alternatively, the dopant may be a p-type dopant such as boron (B) or indium (In). When doping an n-type dopant, the operation 16 creates an ion implantation mask (not shown) that covers p-type device regions in the device 100, and applies the ion implantation process 107 to n-type device regions only. Similarly, when doping a p-type dopant, the operation 16 creates an ion implantation mask (not shown) that covers n-type device regions in the device 100, and applies the ion implantation process 107 to p-type device regions only. In an embodiment, the dopant includes phosphorous and is implanted with a doping energy in a range of about 5 keV to about 15 keV, and a doping dose in the range of about 5E13 $cm^{-2}$ to about 5E15 $cm^{-2}$. In an embodiment, the depth D1 is in a range from about 5 nm to about 20 nm, such as from about 10 nm to about 15 nm.

Figure 6A:
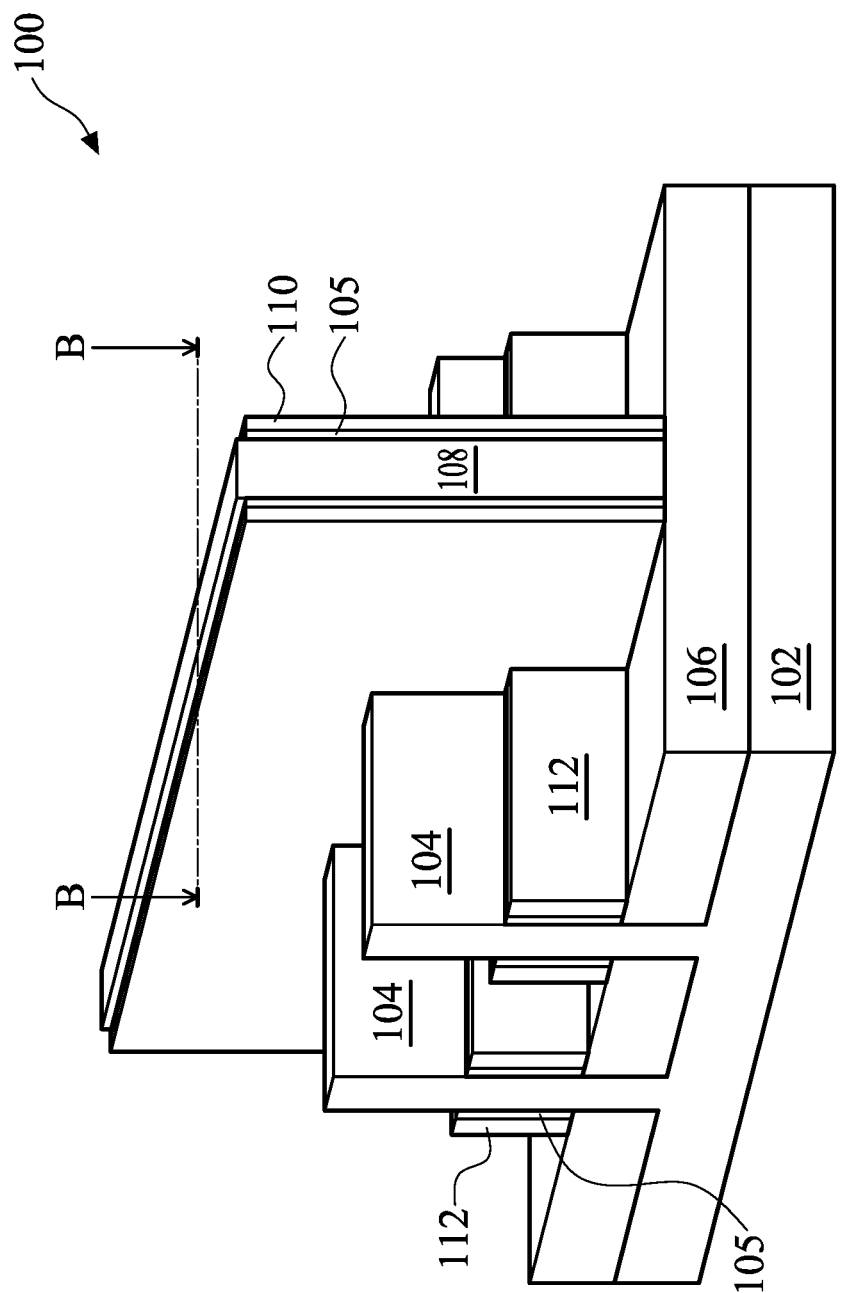

At operation 18, the method 10 (FIG. 1) forms main spacer features over sidewalls of the gate structure 108 and the fins 104 (particularly, over the sidewalls of the offset spacer 105). Referring to FIG. 6A, the main spacer features over the sidewalls of the gate structure 108 are referred to as the gate sidewall (or GSW) spacers 110, while the main spacer features over the sidewalls of the fins 104 are referred to as the fin sidewall (or FSW) spacers 112. In the present embodiment, the GSW spacers 110 and the FSW spacers 112 comprise the same materials. The main spacers 110 and 112 may be a single layer or multi-layer structure. In some embodiments, the main spacers 110 and 112 include a dielectric material, such as silicon oxide ($SiO_2$), silicon nitride ($Si_3N_4$), silicon oxynitride (SiON), other dielectric material, or combination thereof. In an example, the main spacers 110 and 112 are formed by depositing a dielectric layer (e.g., a $Si_3N_4$ layer) as a main D-shaped spacer over the offset spacer 105, and then, anisotropically etching to remove portions of the dielectric layer to form the spacers 110 and 112. The thickness (along the X direction) of the GSW spacer 110 and the offset spacer 105 defines the width of the S/D extension regions 104c.

Figure 6B:
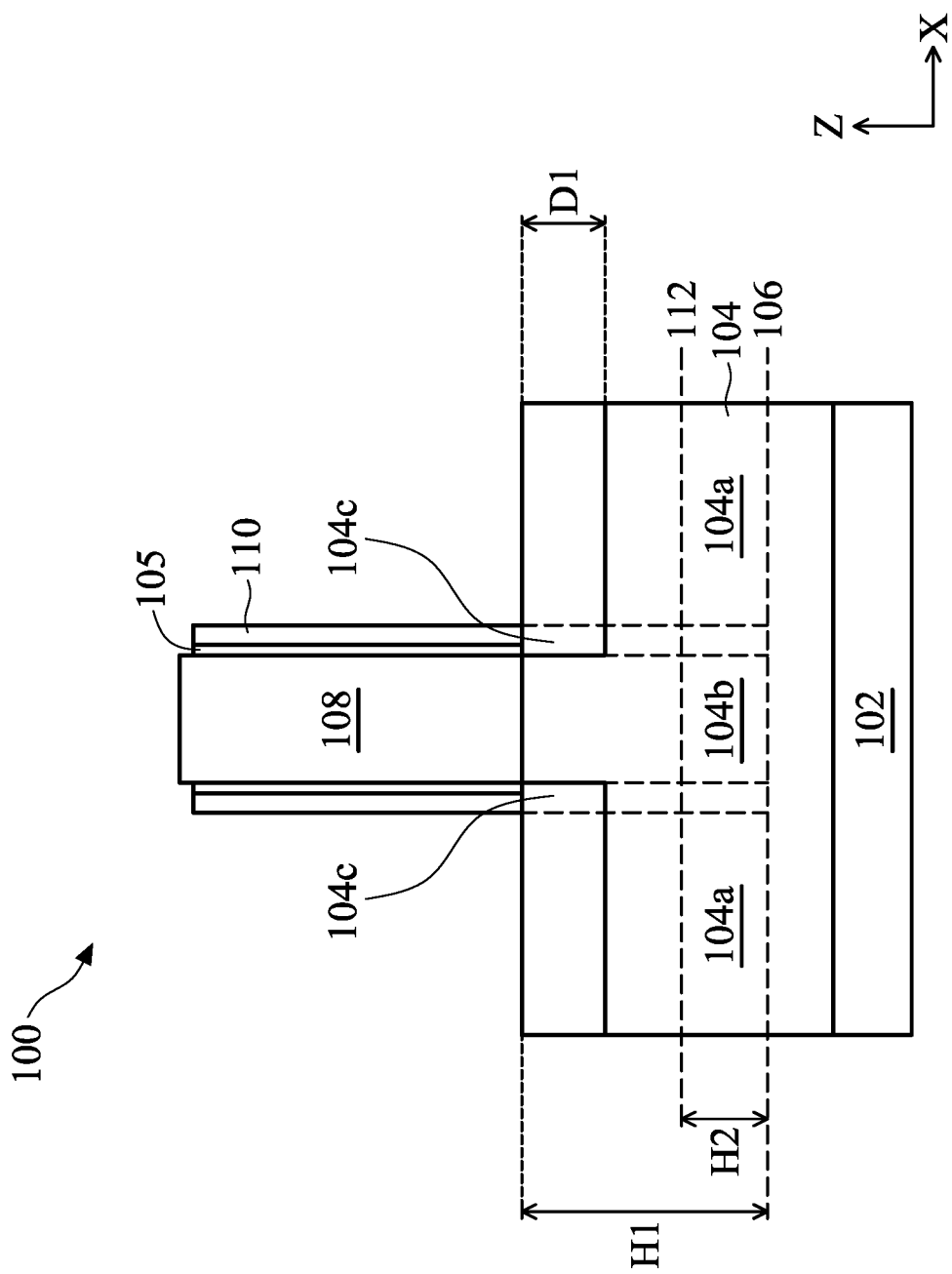

In the present embodiment, the operation 18 controls the height of the FSW spacers 112 during etching processes. FIG. 6B shows a cross-sectional view of the device 100 cut along the B-B line in FIG. 6A, where the top surface of the FSW spacers 112 is illustrated using a dashed line. The FSW spacers 112 and the offset spacer 105 over the sidewalls of the fins 104 have a height H2 as measured from the top surface of the isolation structure 106 to the top surface of the FSW spacers 112. As will be discussed later, the method 10 applies another ion implantation process 109 (FIGS. 8A and 8B) to dope the S/D extension regions 104c for the full height of H1. This is achieved by fully doping both the S/D regions 104a above the FSW spacers 112 and the FSW spacers 112. Particularly, dopants into the FSW spacers 112 diffuse or straggle into adjacent S/D extension regions 104c, doping those regions as a result. To achieve these effects, the height H2 of the FSW spacers is particularly designed according to the present embodiment. On the one hand, the height H2 should not be too large that the ion implantation process 109 cannot penetrate the full depth of the FSW spacers 112. On the other hand, the height H2 should not be too small. Otherwise, the S/D regions 104a above the FSW spacers 112 may be too tall to be fully doped by the ion implantation process 109. In the present embodiment, the height H2 is less than (H1−D1). In a further embodiment, the height H2 is less than (H1−D1) but greater than or equal to (H1−2D1). In yet another embodiment, the height H2 is less than half of H1. In a specific example, the height H1 is about 50 nm to about 60 nm, the depth D1 is about 10 nm to about 20 nm, and the height H2 is about 10 nm to about 30 nm such as from about 10 nm to about 25 nm.

Figure 7A:
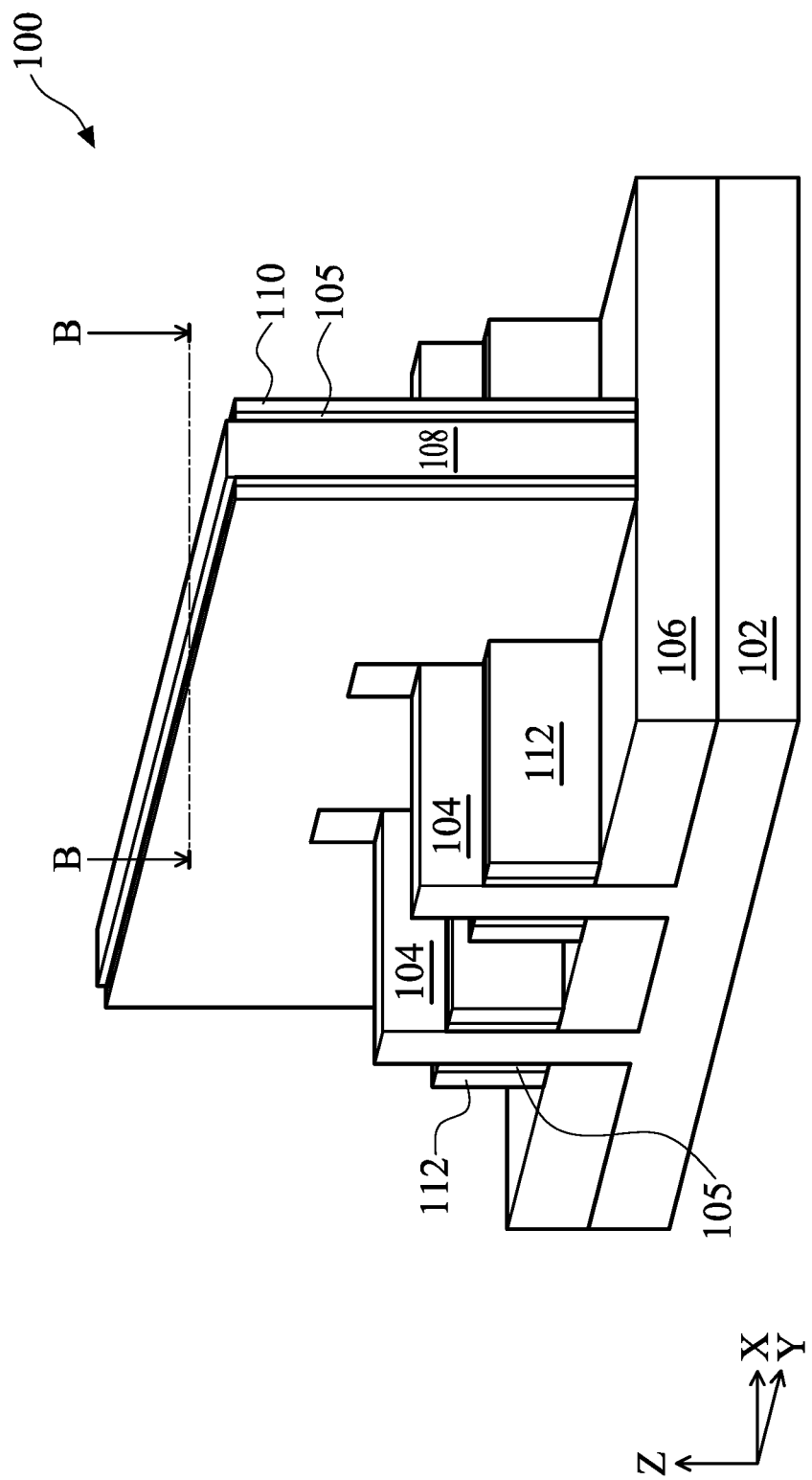
Figure 7B:
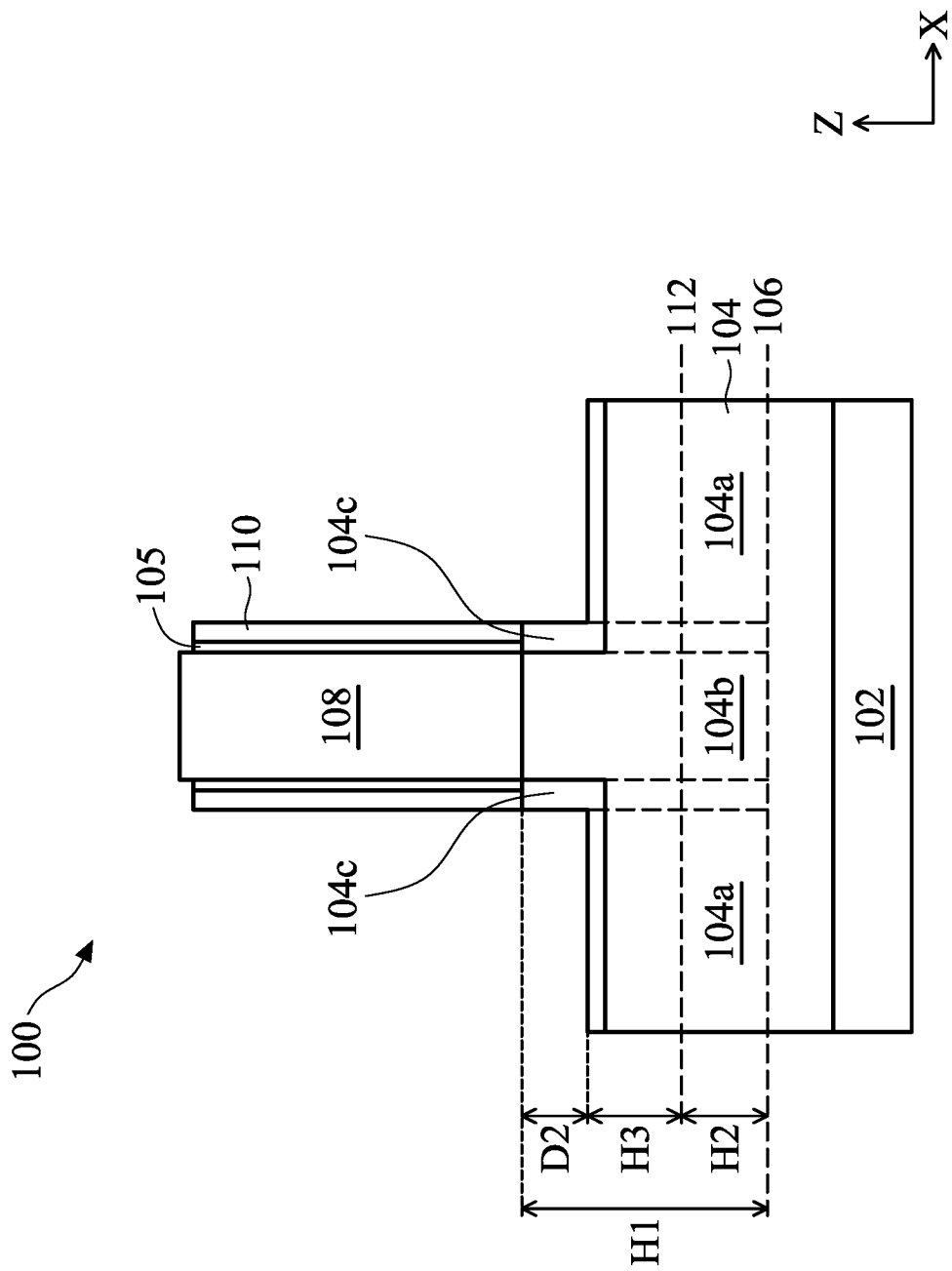

At operation 20, the method 10 (FIG. 1) partially recesses the fins 104, more specifically, the S/D regions 104a. FIG. 7A shows a perspective view of the device 100 after the operation 20, and FIG. 7B shows a cross-sectional view of the device 100 cut along the B-B line in FIG. 7A. In an embodiment, the operation 20 applies an anisotropic etching. For example, it may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. The etching is selective to the materials in the fins 104 and does not (or insignificantly) etch the gate structure 108, the spacers 110 and 112, and the isolation structure 106. The S/D regions 104a are recessed by a depth D2. In an embodiment, the operation 20 may use a timer to control the depth D2 to be in a predefined range. In a particular embodiment, the depth D2 is about equal to the depth D1, for example, within +/−2 nm of D1. The operation 20 results in a portion of the S/D regions 104a having a height H3 above the FSW spacers 112. In an embodiment, the height H3 is designed (or controlled) such that the portion of the S/D regions 104a can be fully doped by an ion implantation process (such as the ion implantation process 109 in FIG. 8A). For example, the height H3 may be controlled to be about the same as the depth D1, for example, within +/−2 nm of D1. In another embodiment, the operation 20 reduces the height of the fins 104 (in the S/D regions 104a) by about 10% to about 30%, i.e., D2 is about 10% to about 30% of H1.

Figure 8A:
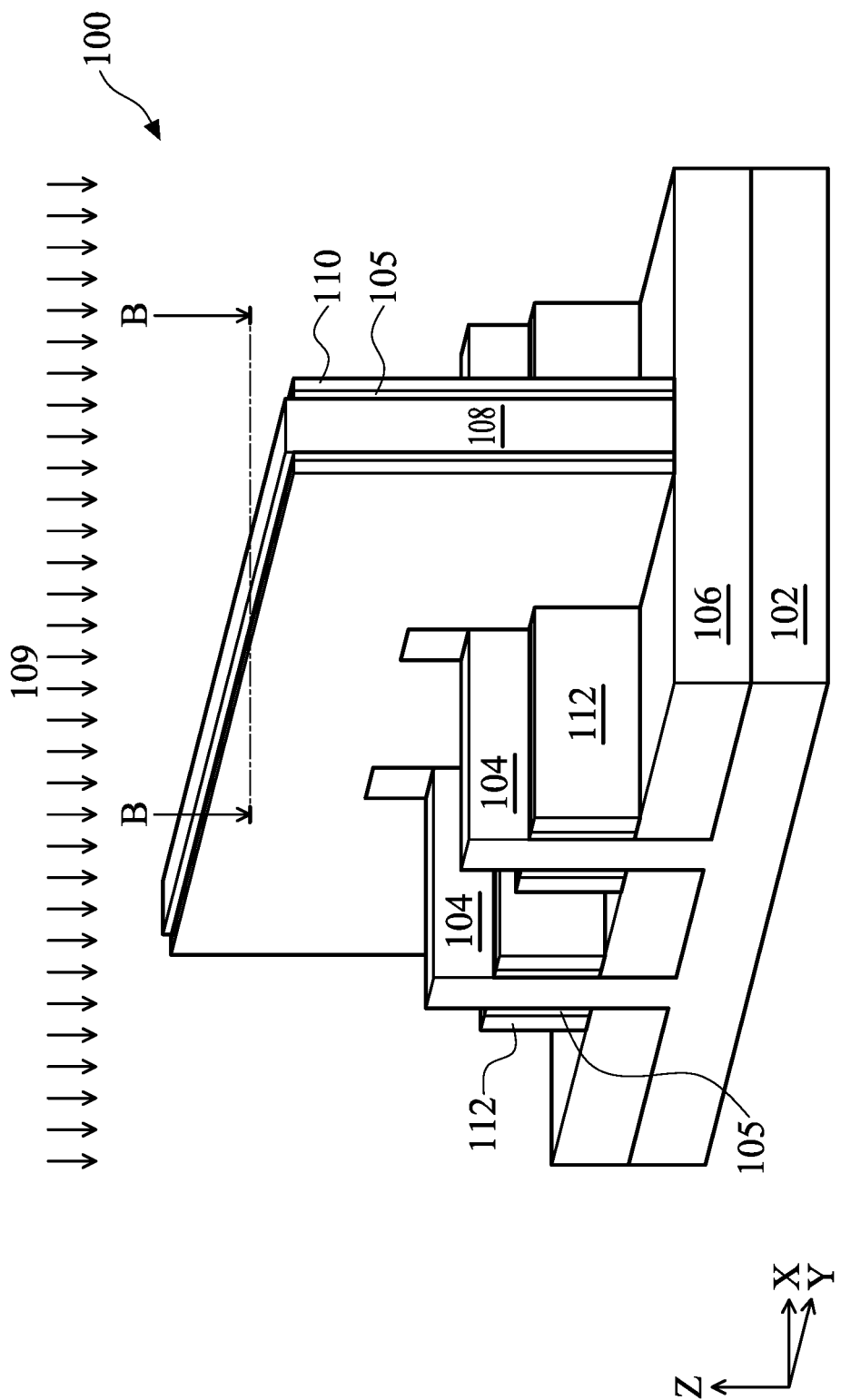

At operation 22, the method 10 (FIG. 1) performs another ion implantation process 109 to introduce a dopant into the device 100, particularly into the fins 104 and the FSW spacers 112 (FIG. 8A). In an embodiment, the dopants introduced by the operations 16 and 22 are of the same type, i.e., they are both n-type or both p-type. In a further embodiment, the dopants introduced by the operations 16 and 22 are the same. For example, they both include phosphorous. Referring to FIG. 8A, the ion implantation process 109 is applied from the top of the device 100. In an embodiment, the ion implantation process 109 is applied with a tilt angle about 5° or less. In an embodiment, the dopant of the operation 22 includes phosphorous and is doped with a doping energy in a range of about 5 keV to about 15 keV, and a doping dose in the range of about 5E13 cm$^{-2}$ to about 5E15 cm$^{-2}$.

Figure 8B:
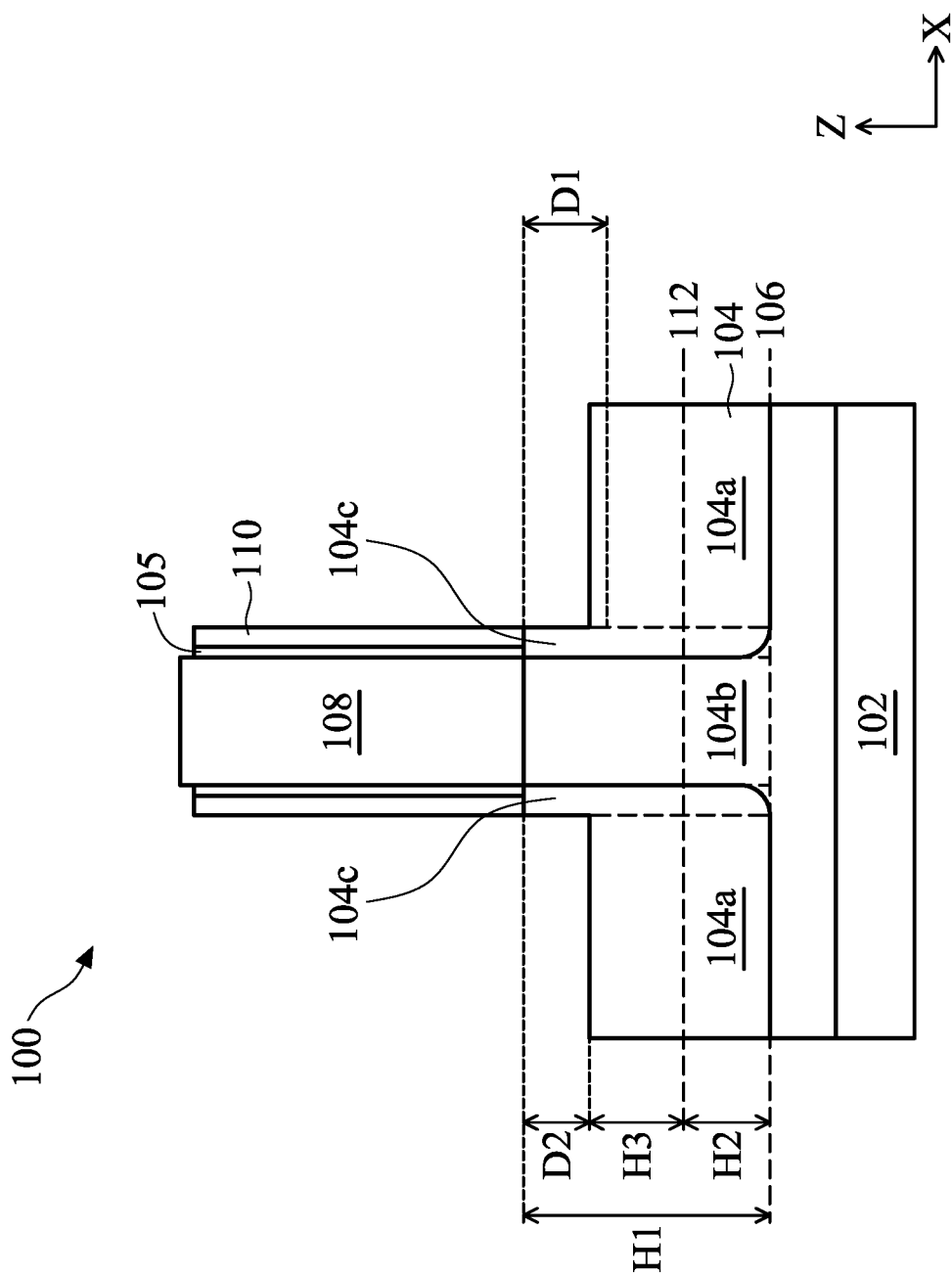

FIG. 8B illustrates a cross-sectional view of the device 100 cut along the B-B line in FIG. 8A, showing the combined results of the ion implantation processes 107 and 109. Referring to FIG. 8B, the S/D extension regions 104c, even though covered by the GSW spacers 110, are fully or substantially fully doped for the full height H1 of the fins 104. Particularly, the top portion (having a height D1) of the S/D extension regions 104c is mainly doped by the ion implantation process 107, the middle portion (having a height H3) of the S/D extension regions 104c is mainly doped by the ion implantation process 109 where the dopants straggle from the S/D regions 104a into this middle portion, and the lower portion (have a height H2) of the S/D extension regions 104c is mainly doped by the ion implantation process 109 where the dopants straggle from the FSW spacers 112 into this lower portion. By combining the first ion implantation process 107 (operation 16), partially recessing the fins 104 (operation 20), and the second ion implantation process 109 (operation 22), embodiments of the present disclosure dope the S/D extension regions 104c uniformly or near uniformly with one or more dopants. This overcomes the shadowing effects in some of the traditional LDD doping processes. Experiments have shown that dopant concentration in the S/D extension regions 104c in a range from about 2E19 to about 5E19 can be achieved by embodiments of the present disclosure.

Figure 9A:
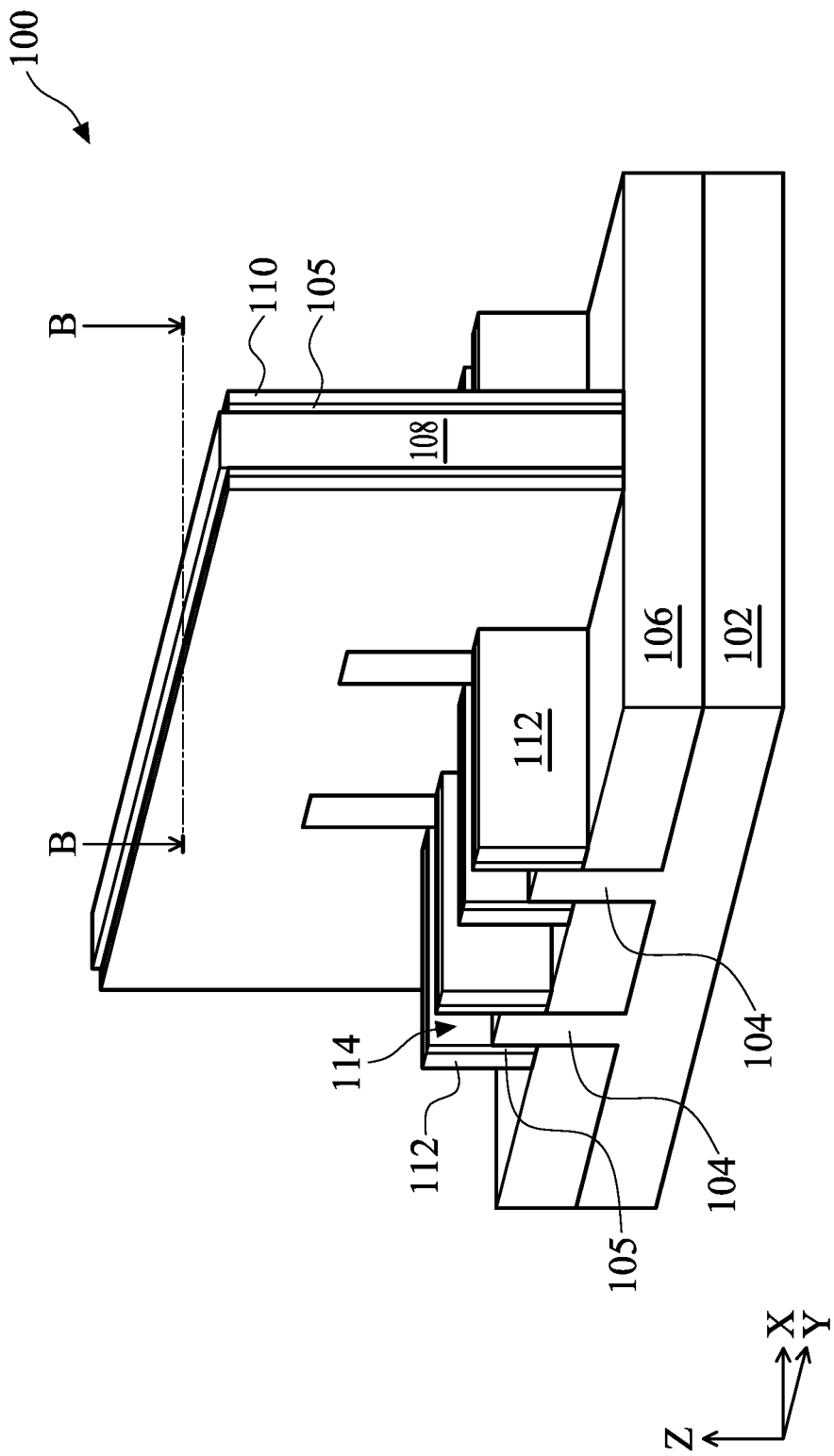
Figure 9B:
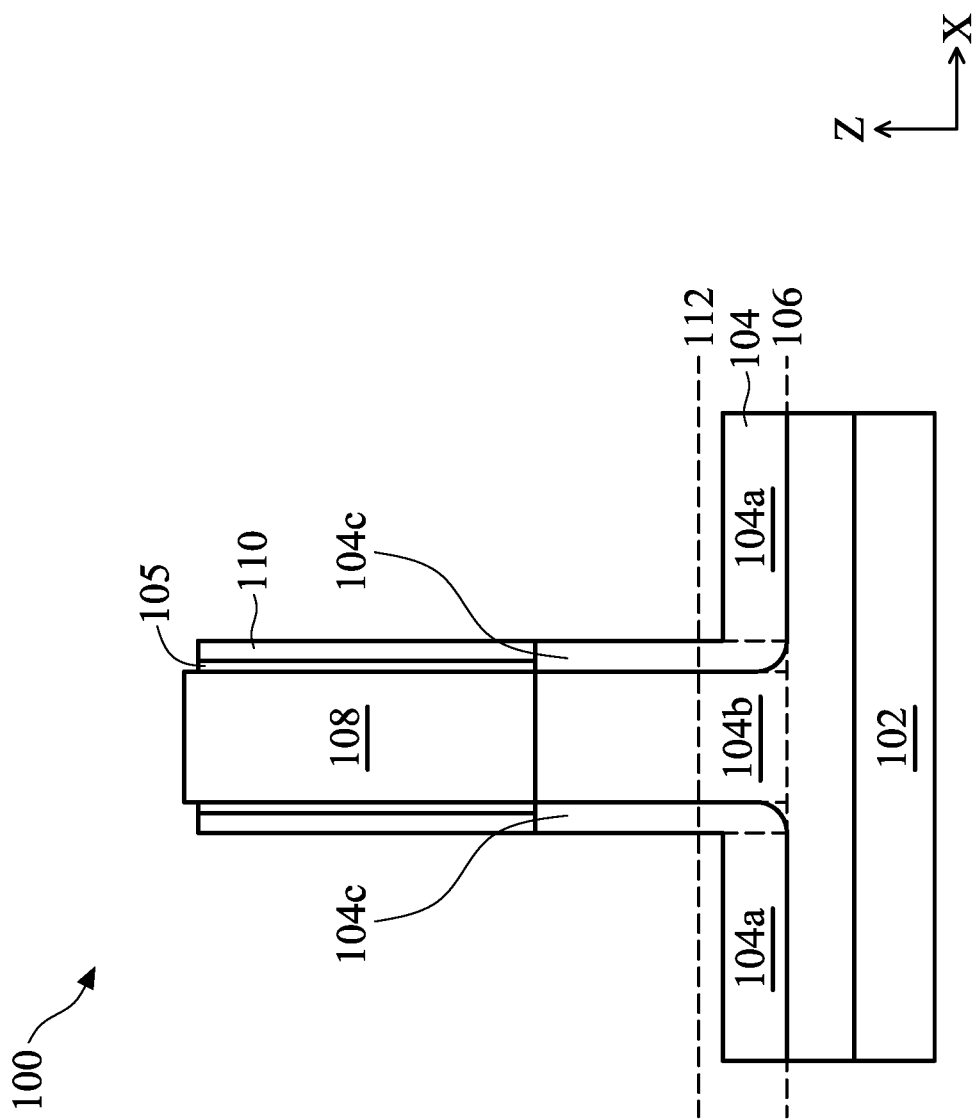

At operation 24, the method 10 (FIG. 1) recesses the S/D regions 104a to form trenches 114 (FIGS. 9A and 9B). FIG. 9A shows a perspective view of the device 100 after the operation 24, and FIG. 9B shows a cross-sectional view of the device 100 along the BB line in FIG. 9A. In the present embodiment, the top surface of the S/D regions 104a is recessed to a level below the top surface of the FSW spacers 112 but above the top surface of the isolation structure 106. In an alternative embodiment, the top surface of the S/D regions 104a is recessed to a level below the top surface of the isolation structure 106. The operation 24 may apply a dry etching process, a wet etching process, an RIE process, other suitable etching processes, or a combination thereof. The etching is selective to the materials in the fins 104 and does not (or insignificantly) etch the gate structure 108, the spacers 110 and 112, and the isolation structure 106. The operation 24 may further include a cleaning process to remove etching residues and to clean surfaces of the fins 104 for the following epitaxial growth process.

Figure 10A:
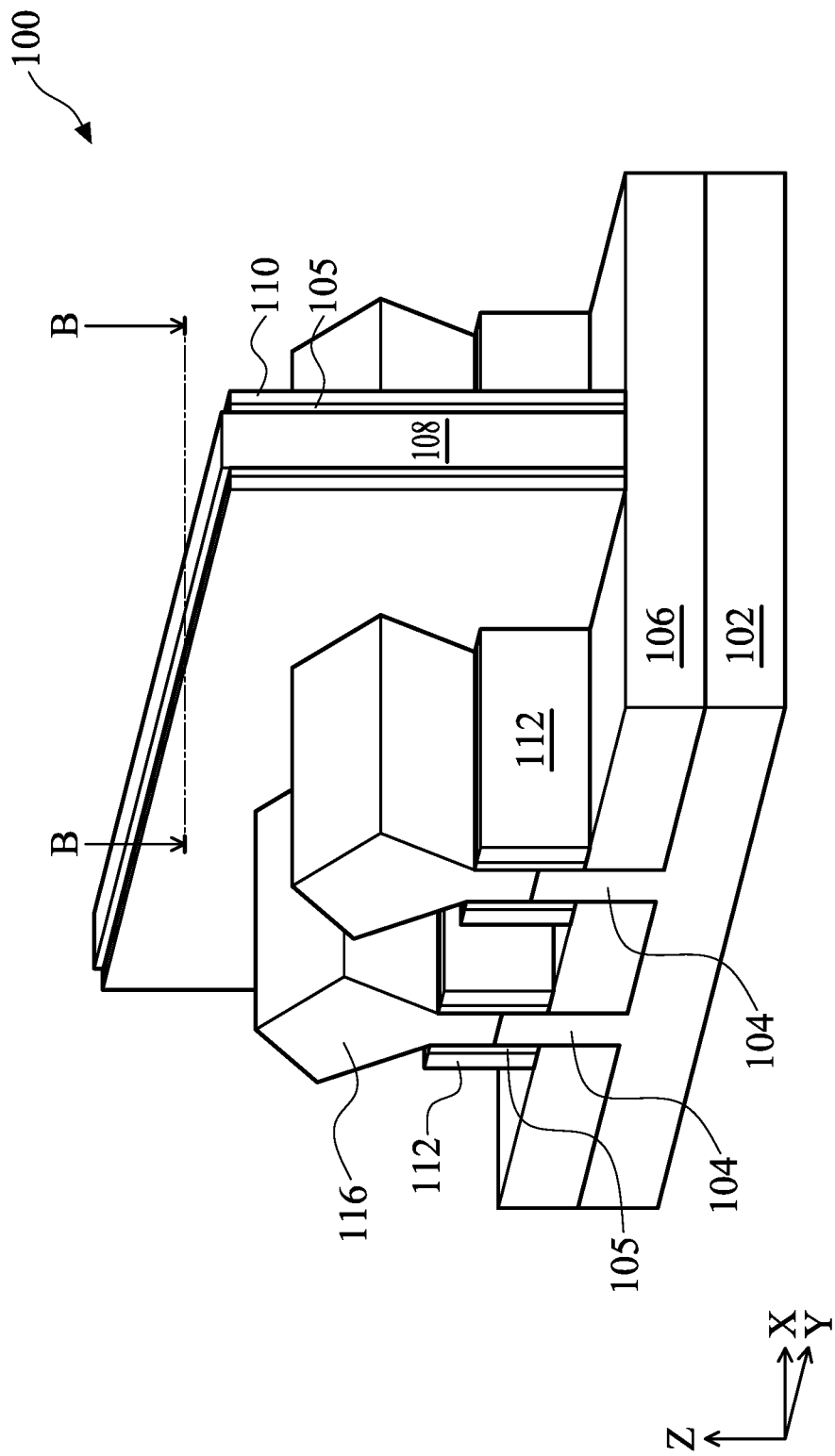
Figure 10B:
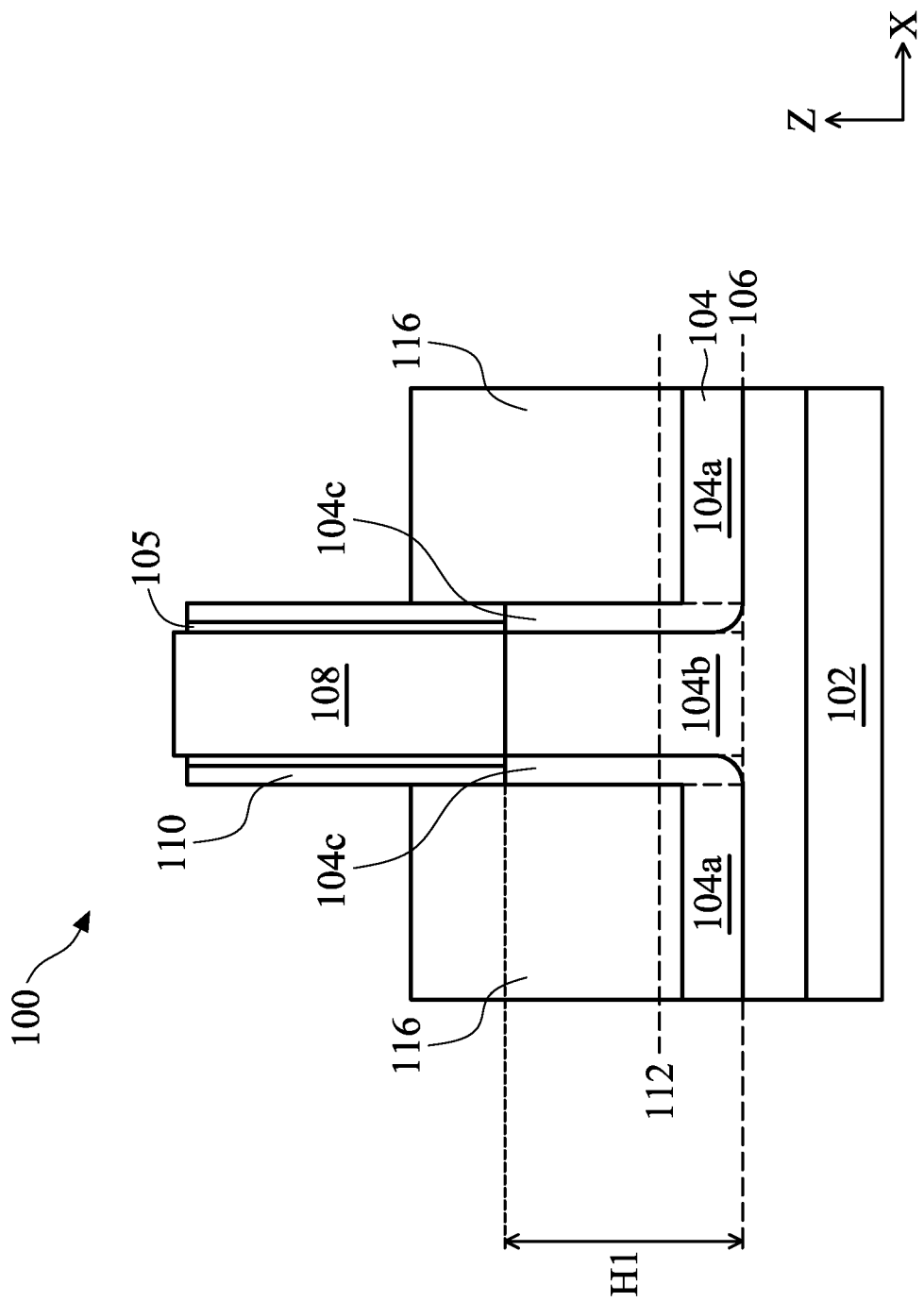

At operation 26, the method 10 (FIG. 1) epitaxially grows one or more semiconductor materials 116 (referred to as epitaxial features 116) in the trenches 114 as S/D features. FIG. 10A shows a perspective view of the device 100 after the operation 26, and FIG. 10B shows a cross-sectional view of the device 100 along the B-B line in FIG. 10A. Referring to FIG. 10A, the epitaxial features 116 grow from the trenches 114 and expand above the FSW spacers 112. Adjacent epitaxial features 116 may be separated from each other (as shown) or may merge together (not shown) in some embodiments, depending on their pitch and sizes. The features 116 may include epitaxially grown silicon (Si) or silicon carbide (SiC) for n-type FinFETs, or epitaxially grown silicon germanium (SiGe) for p-type FinFETs. Further, the epitaxial features 116 may be doped with proper dopants suitable for the respective n-type and p-type FinFETs. For example, the epitaxial features 116 may be doped with an n-type dopant such as phosphorus (P) or arsenic (As), or a p-type dopant such as boron (B) or indium (In). The epitaxial features 116 may be doped in situ or ex-situ.

Referring to FIGS. 10A and 10B, the device 100 at this fabrication stage includes the fins 104, the gate structure 108 engaging the channel region 104b, and the GSW spacers 110 on sidewalls of the gate structure 108. The GSW spacers 110 are disposed over the S/D extension regions 104c. The device 100 further includes the epitaxial features 116 adjacent to the GSW spacers 110 and the S/D extension regions 104c, and the FSW spacers 112 on sidewalls of a lower portion of the epitaxial features 116. In an embodiment, a majority of the S/D extension regions 104c are doped with one or more dopants, such as phosphorous. In a further embodiment, the S/D extension regions 104c are doped with the one or more dopants for the full (or substantially full) height H1 of the fin 104. The FSW spacers 112 are also doped with one or more dopants. In an embodiment, a majority of the FSW spacers 112 are doped with the one or more dopants. Particularly, the dopants in the FSW spacers 112 are also included in the S/D extension regions 104c. In a specific embodiment, the dopant concentration in the FSW spacers 112 is greater than the dopant concentration in the S/D extension regions 104c. In a further embodiment, the dopant concentration in the S/D extension regions 104c is 5E19 cm$^{-2}$ or higher. In yet another embodiment, the portions of the S/D regions 104a sandwiched between the FSW spacers 112 are also doped with the one or more dopants.

Figure 10C:
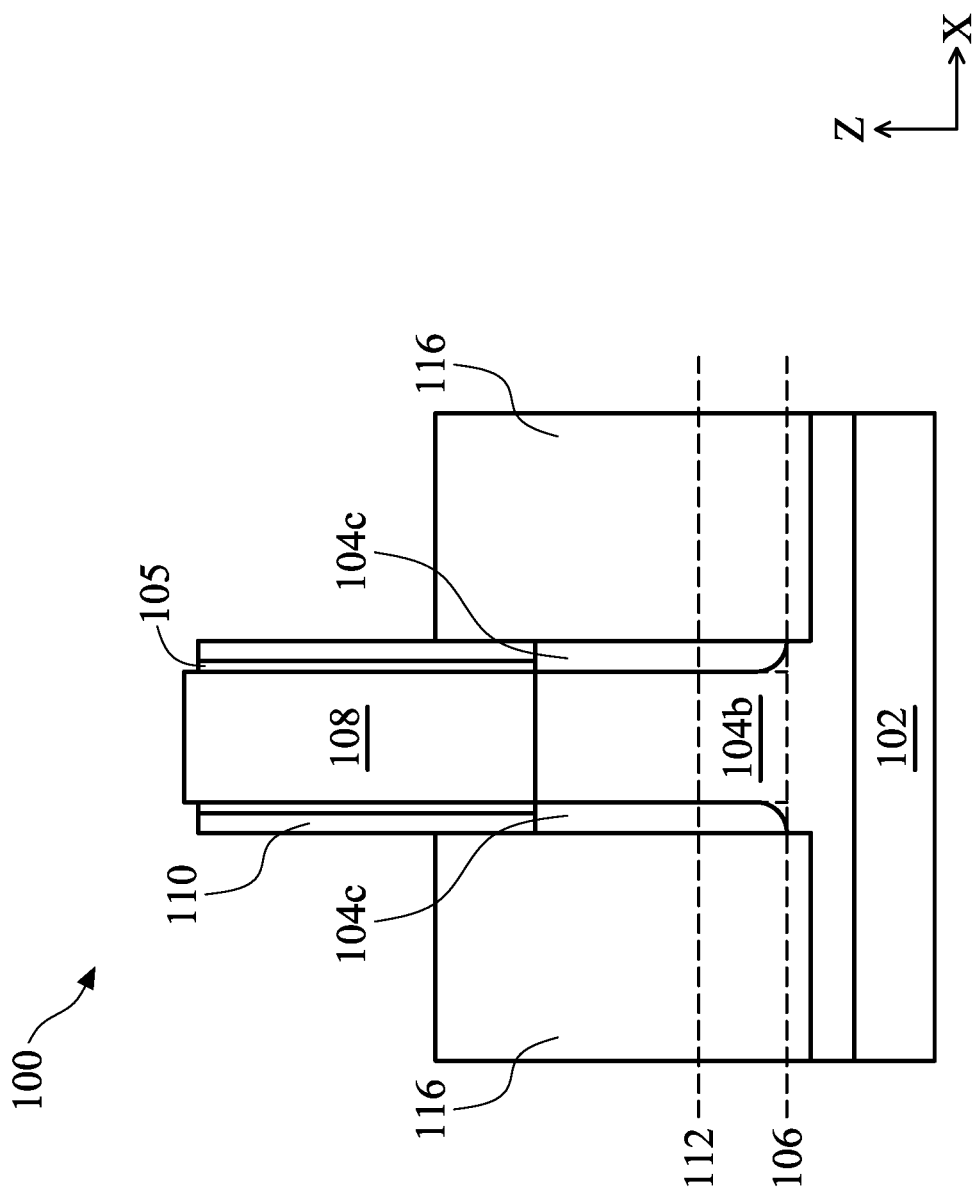

FIG. 10c shows a variation of the device 100 where the S/D regions 104a are recessed to a level below the top surface of the isolation structure 106 during the operation 24. Other aspects of this variation are the same as the one in FIG. 10B.

At operation 28, the method 10 (FIG. 1) performs other fabrication processes to form a complete IC device. For example, the operation 28 may deposit a contact etch stop layer (or CESL) covering the various structures on the device 100, including the epitaxial features 116, the FSW spacers 112, the isolation structure 106, the GSW spacers 110, and the gate structure 108. The CESL may include silicon nitride (Si$_3$N$_4$), silicon oxynitride (SiON), silicon nitride with oxygen (O) or carbon (C) elements, and/or other materials; and may be formed by PECVD process and/or other suitable deposition or oxidation processes. Thereafter, the operation 28 may deposit an interlayer dielectric (ILD) layer over the CESL. The ILD layer may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer may be deposited by a PECVD process, a flowable CVD (FCVD) process, or other suitable deposition technique.

After the deposition of the ILD layer, the operation 28 may remove the gate structure 108 using one or more etching processes to form a gate trench and deposit a high-k metal gate in the trench. The high-k metal gate may include a high-k gate dielectric layer, a work function layer over the high-k gate dielectric layer, and a metal layer over the work function layer. The high-k gate dielectric layer may include hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof; and may be formed by ALD and/or other suitable methods. The work function layer may be p-type or n-type. The p-type work function layer may comprise a metal selected from but not limited to the group of titanium nitride (TiN), tantalum nitride (TaN), ruthenium (Ru), molybdenum (Mo), tungsten (W), platinum (Pt), or combinations thereof. The n-type work function layer may comprise a metal selected from but not limited to the group of titanium (Ti), aluminum (Al), tantalum carbide (TaC), tantalum carbide nitride (TaCN), tantalum silicon nitride (TaSiN), or combinations thereof. The work function layer may include a plurality of layers and may be deposited by CVD, PVD, and/or other suitable process The metal layer may include aluminum (Al), tungsten (W), cobalt (Co), copper (Cu), and/or other suitable materials; and may be deposited using plating, CVD, PVD, or other suitable processes.

The operation 28 may further form contact plugs, metal interconnect, and various other features to complete the device 100.

Although not intended to be limiting, one or more embodiments of the present disclosure provide many benefits to a semiconductor device and a formation process thereof. For example, embodiments of the present disclosure implement a process having a first doping, a recessing, and a second doping to completely dope S/D extension regions in fins. The disclosed process obtains such benefits even with ion implantation that is substantially vertical (e.g., tilt angle within 5 degrees), avoiding shadowing effects in some of the traditional LDD doping processes. Embodiments of the present disclosure can be readily integrated into existing semiconductor manufacturing processes.

In one exemplary aspect, the present disclosure is directed to a method. The method includes providing a structure that includes a substrate, a fin over the substrate, and a gate structure engaging the fin; performing a first implantation process to implant a dopant into the fin adjacent to the gate structure; and forming gate sidewall spacers over sidewalls of the gate structure and fin sidewall spacers over sidewalls of the fin. The method further includes performing a first etching process to recess the fin adjacent to the gate sidewall spacers while keeping at least a portion of the fin above the fin sidewall spacers. After the first etching process, the method further includes performing a second implantation process to implant the dopant into the fin and the fin sidewall spacers. After the second implantation process, the method further includes performing a second etching process to recess the fin adjacent to the gate sidewall spacers until a top surface of the fin is below a top surface of the fin sidewall spacers, resulting in a trench between the fin sidewall spacers; and epitaxially growing a semiconductor material in the trench.

In an embodiment of the method, the first implantation process dopes the dopant into the fin up to a first depth, the portion of the fin above the fin sidewall spacers before the second etching process has a first height, and the first depth is about same as the first height. In another embodiment of the method, the first implantation process dopes the dopant into the fin up to a first depth, the first etching process reduces a height of the fin by a second depth, and the first depth is about same as the second depth.

In another embodiment of the method, the fin has a first height, the first implantation process dopes the dopant into the fin up to a first depth, the fin sidewall spacers have a second height, and the second height is less than the first height minus the first depth. In a further embodiment, the second height is greater than or equal to the first height minus twice of the first depth.

In an embodiment of the method, a height of the fin sidewall spacer is about 10 nm to about 25 nm during the second implantation process. In an embodiment, the dopant includes a p-type dopant. In another embodiment, the dopant includes an n-type dopant. In a further embodiment, the dopant includes phosphorus.

In another embodiment of the method, the fin sidewall spacers include silicon nitride. In yet another embodiment of the method, the second implantation process is performed with a tilt angle of 0 to about 5 degrees.

In another exemplary aspect, the present disclosure is directed to a method. The method includes providing a structure that includes a substrate, a fin over the substrate, and a gate structure engaging the fin. The method further includes first implanting a dopant into the fin, resulting in a doped upper portion of the fin; and forming gate sidewall spacers over sidewalls of the gate structure and fin sidewall spacers over sidewalls of the fin, wherein the fin sidewall spacers are below the doped upper portion of the fin. The method further includes first recessing the fin adjacent to the gate sidewall spacers while keeping at least a portion of the fin above the fin sidewall spacers. The method further includes second implanting the dopant into the fin and the fin sidewall spacers; second recessing the fin adjacent to the gate sidewall spacers, resulting in a trench between the fin sidewall spacers; and epitaxially growing a semiconductor material in the trench.

In an embodiment of the method, a depth of the first recessing is about equal to a height of the doped upper portion of the fin. In another embodiment of the method, the second implanting of the dopant completely penetrates the portion of the fin above the fin sidewall spacers. In yet another embodiment of the method, the second implanting of the dopant completely penetrates the fin sidewall spacers. In yet another embodiment of the method, both the first and second implanting of the dopant are performed with a tilt angle about 5 degrees or less.

In yet another exemplary aspect, the present disclosure is directed to a semiconductor device. The semiconductor device includes a substrate; an isolation structure over the substrate; a fin over the substrate and the isolation structure; a gate structure engaging a first portion of the fin; first sidewall spacers over sidewalls of the gate structure and over a second portion of the fin; epitaxial source/drain (S/D) features over a third portion of the fin and adjacent to the first sidewall spacers; and second sidewall spacers over the isolation structure and over sidewalls of a portion of the epitaxial S/D features, wherein a dopant is distributed in a majority of the second portion of the fin.

In an embodiment of the semiconductor device, the majority of the second portion of the fin includes the dopant in a concentration of $5E19$ $cm^{-2}$ or higher. In another embodiment of the semiconductor device, the dopant is also distributed in a majority of the second sidewall spacers. In a further embodiment, the dopant includes phosphorus and the second sidewall spacers include silicon nitride.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
an isolation structure over the substrate;
a fin over the substrate and the isolation structure;
a gate structure engaging a first portion of the fin;
first sidewall spacers over sidewalls of the gate structure and over a second portion of the fin;
source/drain (S/D) features adjacent to the first sidewall spacers, wherein the S/D features are grown over a third portion of the fin that is different from the first and the second portions of the fin; and
second sidewall spacers over the isolation structure and over sidewalls of a portion of the S/D features, wherein the second sidewall spacers include a dielectric material, and the second sidewall spacers and the second portion of the fin include a same dopant, wherein the first portion of the fin has a first height above the isolation structure, the second sidewall spacers have a second height above the isolation structure, and the second height is less than half of the first height.

2. The semiconductor device of claim 1, wherein the dopant is distributed in a majority of the second portion of the fin.

3. The semiconductor device of claim 2, wherein the majority of the second portion of the fin includes the dopant in a concentration of 5E19 $cm^{-2}$ or higher.

4. The semiconductor device of claim 2, wherein the dopant is also distributed in a majority of the second sidewall spacers.

5. The semiconductor device of claim 1, wherein the dopant includes phosphorus and the second sidewall spacers include silicon nitride.

6. The semiconductor device of claim 1, wherein the first height is in a range of 50 nm to 60 nm, and the second height is in a range of 10 nm to 30 nm.

7. The semiconductor device of claim 1, wherein a top surface of the third portion of the fin is below a top surface of the isolation structure.

8. The semiconductor device of claim 1, wherein the second sidewall spacers contain the dopant at a higher concentration than the second portion of the fin does.

9. A semiconductor device, comprising:
a substrate;
an isolation structure over the substrate;
a fin over the substrate, wherein the fin is oriented lengthwise generally along a first direction and at least a portion of the fin protrudes above the isolation structure;
a gate structure engaging a first portion of the fin, wherein the gate structure is oriented lengthwise generally along a second direction perpendicular to the first direction;
first spacers over sidewalls of the gate structure and over a second portion of the fin, wherein the first spacers are oriented lengthwise generally along the second direction;
source/drain (S/D) features adjacent to the first spacers; and
second spacers over the isolation structure and over sidewalls of a portion of the S/D features, wherein the second spacers are oriented lengthwise generally along the first direction, the second spacers include a dielectric material and a dopant at a first concentration, the second portion of the fin includes the dopant at a second concentration that is lower than the first concentration, wherein the first portion of the fin has a first height above the isolation structure, the second spacers have a second height above the isolation structure, and the second height is less than half of the first height.

10. The semiconductor device of claim 9, wherein the second concentration is 5E19 $cm^{-2}$ or higher.

11. The semiconductor device of claim 9, wherein the first height is about 50 nm to about 60 nm, and the second height is about 10 nm to about 25 nm.

12. The semiconductor device of claim 9, wherein the dopant includes phosphorus.

13. The semiconductor device of claim 12, wherein the second spacers include silicon nitride.

14. A semiconductor device, comprising:
a substrate;
an isolation structure over the substrate;
a fin over the substrate;
a gate structure over the isolation structure and engaging a first portion of the fin;
first spacers over sidewalls of the gate structure and over a second portion of the fin that extends above a top surface of the isolation structure;
source/drain (S/D) features adjacent to the first spacers; and
second spacers over the isolation structure and over sidewalls of a portion of the S/D features, wherein the second spacers include a dielectric material, and the second spacers and the second portion of the fin include a same dopant, wherein a concentration of the dopant in the second portion of the fin is about uniform throughout the second portion of the fin, wherein the second portion of the fin has a first height above the top surface of the isolation structure, the second spacers have a second height above the top surface of the isolation structure, and the second height is less than half of the first height, wherein the dopant includes phosphorus and the second spacers include silicon nitride.

15. The semiconductor device of claim 14, wherein the concentration is 5E19 $cm^{-2}$ or higher.

16. The semiconductor device of claim 1, wherein the second sidewall spacers include silicon oxide, silicon nitride, or silicon oxynitride.

17. The semiconductor device of claim 9, wherein the fin includes silicon or silicon germanium and the second spacers include silicon oxide, silicon nitride, or silicon oxynitride.

18. The semiconductor device of claim 14, wherein the first height is about 50 nm to about 60 nm, and the second height is about 10 nm to about 25 nm.

* * * * *